US010706952B1

(12) United States Patent
Gregor et al.

(10) Patent No.: US 10,706,952 B1
(45) Date of Patent: Jul. 7, 2020

(54) TESTING FOR MEMORIES DURING MISSION MODE SELF-TEST (71) Applicant: Cadence Design Systems, Inc., San Jose, CA (US)

(72) Inventors: Steven Lee Gregor, Oswego, NY (US); Patrick Gallagher, Apalachin, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 60 days.

(21) Appl. No.: 16/012,455

(22) Filed: Jun. 19, 2018

(51) Int. Cl.
*G11C 29/44* (2006.01)
*G11C 29/20* (2006.01)
*G11C 29/36* (2006.01)
*G11C 29/42* (2006.01)

(52) U.S. Cl.
CPC .............. *G11C 29/44* (2013.01); *G11C 29/20* (2013.01); *G11C 29/36* (2013.01); *G11C 29/42* (2013.01)

(58) Field of Classification Search
CPC ....................................................... G11C 29/44
See application file for complete search history.

(56) References Cited

U.S. PATENT DOCUMENTS

| 5,555,249 | A  | * | 9/1996 | Hilley ................... G11C 29/08 714/1 |
| 6,934,205 | B1 | * | 8/2005 | Pandey ................... G06F 11/27 365/200 |
| 2008/0010567 | A1 | * | 1/2008 | Hughes ................... G11C 29/16 714/718 |
| 2008/0201620 | A1 | * | 8/2008 | Gollub ................ G06F 11/1044 714/718 |
| 2009/0132876 | A1 | * | 5/2009 | Freking ................. G06F 11/106 714/723 |
| 2017/0206982 | A1 | * | 7/2017 | Huch ..................... G11C 11/417 |
| 2019/0019569 | A1 | * | 1/2019 | Pope ...................... G11C 29/46 |

OTHER PUBLICATIONS

A. Dutta, M. Shah, G. Swathi and R. A. Parekhji, "Design techniques and tradeoffs in implementing non-destructive field test using logic BIST self-test," 2009 15th IEEE International On-Line Testing Symposium, Sesimbra, Lisbon, 2009, pp. 237-242.*

* cited by examiner

*Primary Examiner* — Steve N Nguyen
(74) *Attorney, Agent, or Firm* — Tarolli, Sundheim, Covell & Tummino LLP (57) ABSTRACT

Systems and methods disclosed herein provide for efficiently testing memories during mission mode self-test ("MMST") without destroying any original functional data. Embodiments provide for a converter to feed a manipulated version of the original functional data back into the tested memories. Embodiments further provide an accumulator to count the occurrences of correctable and uncorrectable errors associated with the tested memories.

20 Claims, 4 Drawing Sheets

TESTING FOR MEMORIES DURING MISSION MODE SELF-TEST

TECHNICAL FIELD

The present application relates to an improved diagnostics system and method for efficiently testing memories during mission mode self-test.

BACKGROUND

Testing can occur in three different phases of a system on a chip (SoC) life-cycle: a manufacturing test (MFGT), a power-on-self-test (POST), and a mission mode self-test (MMST). Each phase of the testing process carries its own requirements and goals.

In the first phase of testing, MFGT, memories are tested with a memory built-in self-test (MBIST) using a set of data backgrounds and algorithms. In particular, the MBIST first writes information into the memory cell arrays and then reads output information from the memory cell arrays for comparison against expected data. An exhaustive set of built-in and programmable tests are usually run during MFGT. The purpose of these tests is to try to remove bad chips from the pool which will eventually be packaged into products, thereby improving the initial quality of the shipped product. Further, these tests are destructive, i.e., the original memory data content is not preserved.

The second phase of testing, POST, varies dependent on the technology node and market that the SoC is targeting. As its name implies, POST occurs when the SoC is activated prior to normal operations commencing, e.g., once the power-on button of a device is activated. POST goals vary from MFGT. For example, test time limitations become more prominent compared to MFGT, especially in battery operated, hand-held devices as users have functional device availability expectations once the power-on button is engaged. As such, the quality level of testing for POST is not as stringent as MFGT because it is assumed that the SoC had been thoroughly tested at MFGT. In other words, POST is more of a sign-off test, e.g., go/no-go indication, prior to customer use. Specifically, POST ensures that the SoC will operate as expected during functional operation until the next POST (e.g., the next time the power-on button is activated). However, similar to MFGT, the tests during POST are also destructive, i.e., the original memory data content is not preserved.

The third phase of testing, MMST, is performed during operational periods between POST operations. During MMST, logical partitions within the chip are designed to be temporarily varied offline during normal functional operations, enabling some level of testing, e.g., MBIST, to occur on that partition while the rest of the device is functionally operational. However, as noted above, MBIST is generally destructive and, therefore, the data within the tested partition must first be saved and then restored as the partition varies offline and then back online. Further, the real time operating system ("RTOS") of the SoC allocates a time slice during which the saving of the partition's data, testing of the partition's memories, and restoring of the partition's data must all be handled. In other words, test time is critical during MMST. As such, any time spent saving and restoring the partition's data will be seen as overhead. In addition, saving and restoring the partition's data also requires additional chip area resources resulting in still more overhead.

Accordingly, there is a need to efficiently test memories during MMST without destroying any functional data within the tested memories.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide MBIST diagnostic systems and methods for efficiently testing memories during MMST without destroying any functional data within the tested memories. The systems and methods herein address at least one of the problems discussed above.

According to an embodiment, an MBIST diagnostics system includes: a memory, wherein the memory includes a physical memory module and a logical memory module; and a converter, wherein the converter is configured to (i) receive functional data from the logical memory module, (ii) convert the received functional data, and (iii) feed the converted functional data to the logical memory module; wherein the logical memory module is configured to generate at least one output corresponding to at least one of the functional data and the converted functional data.

According to an embodiment, a diagnostics method for MBIST includes: receiving, with a converter, functional data from a logical memory module of a memory; converting, with the converter, the received functional data; feeding, with the converter, the converted functional data to the logical memory module; and generating, with the logical memory module, at least one output corresponding to at least one of the functional data and the converted functional data.

Figure 1:
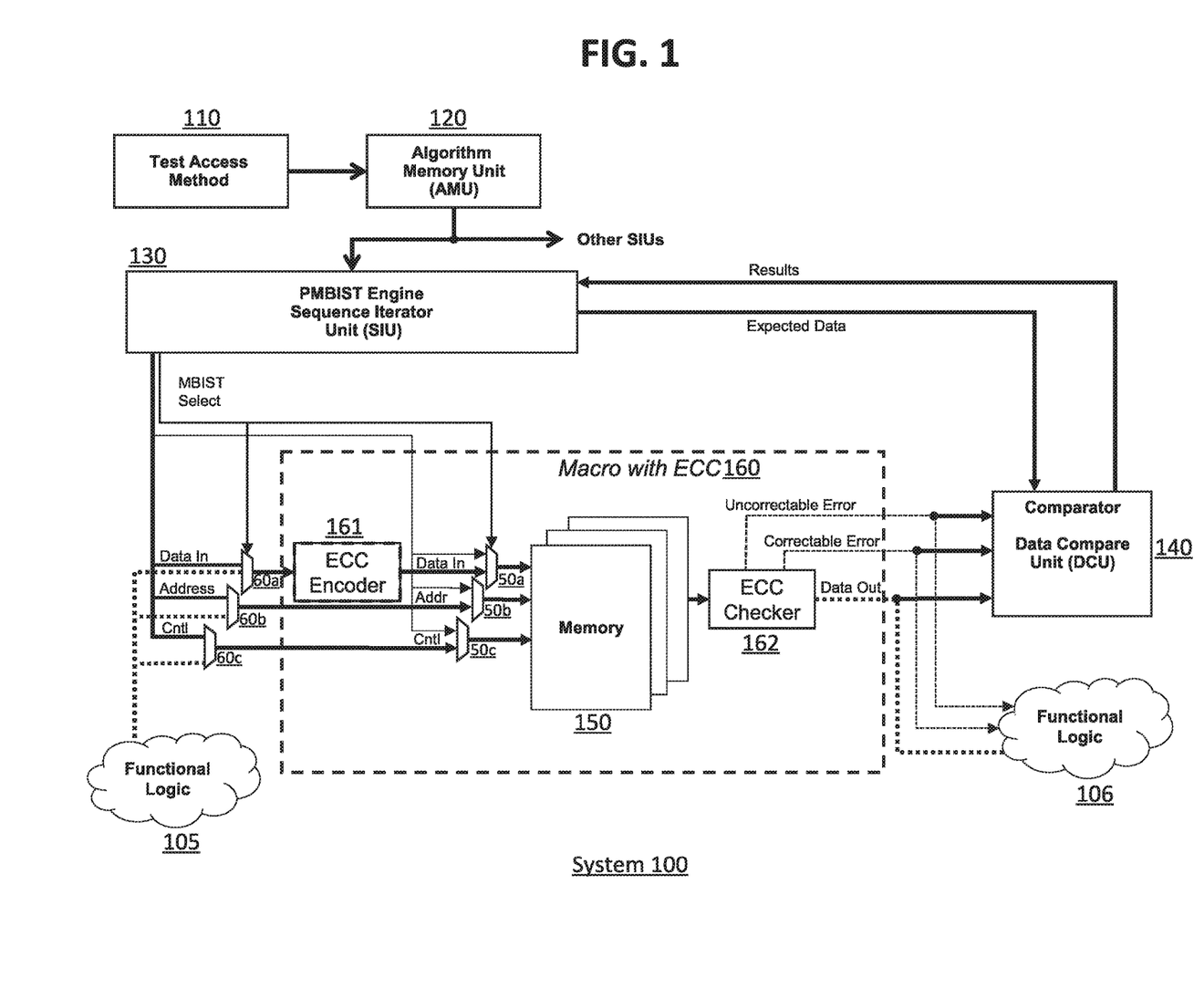
FIG. 1 illustrates an example embodiment of an MBIST diagnostics system.

FIG. 1 illustrates an example embodiment of an MBIST diagnostics system. As depicted in the figure, MBIST diagnostics system 100 includes a test access method ("TAM") 110, algorithm memory unit ("AMU") 120, sequence iterator unit ("SIU") ("engine") 130, data compare unit ("DCU") ("comparator") 140, memories 150, and macro 160. In an embodiment, the system 100 can also include a plurality of other SIUs 130. In an embodiment, each SIU 130 can interact with one or more memories 150 and associated DCUs 140.

In an embodiment, the TAM 110 is a means of communicating from outside the chip. In an embodiment, the TAM 110 can be implemented through either a "Joint Test Action Group" ("JTAG") or "Direct Access" interface. In an embodiment, the JTAG interface includes a plurality of pins (e.g., four or five pins) that are utilized to extract test information during the memory test. In an embodiment, the "Direct Access" interface corresponds to a different set of pins that doesn't require quite the complexity of the JTAG interface. For example, the "Direct Access" interface only requires a set of two pins. Further, because the "Direct Access" pins can be shared with some other ports, no additional overhead is required. Therefore, in an embodiment, the "Direct Access" interface can internally mimic the behavior of JTAG macros but, instead, with minimum area requirements. In an embodiment, the AMU 120 contains the programs (e.g., algorithms) that run in the MBIST logic against the memory 150. In an embodiment, the AMU 120 distributes the above program information into the SIU 130. Specifically, a program previously-loaded onto the AMU 120 is distributed one line at a time to the SIU 130.

In an embodiment, the SIU 130 can be utilized to test a physical view of the memories 150 or a logical view of the memories 150, i.e., the macro 160. In an embodiment, the physical view of the memories 150 includes the memories 150. On the other hand, the macro 160 includes the memories 150 as well as additional logic, e.g., error correction code ("ECC") logic. In an embodiment, ECC logic is used for verifying the memories during the functional operation (e.g., non-test mode) of the SoC. In an embodiment, the ECC logic of the macro 160 includes an ECC encoder 161 and an ECC checker 162. In some embodiments, the ECC encoder 161 and the ECC checker 162 are included in a single logical arrangement that interacts with the memories 150. In an embodiment, the logical memory corresponds to data before applying the ECC encoder 161 and after applying the ECC checker 162. As such, the physical memory (e.g., memories 150), which takes into consideration bits added by the ECC encoder 161, may be wider than the logical memory. For example, the logical memory before the ECC encoder 161 and after the ECC checker 162 may be 32 bits wide while the width of the physical memories 150 may be 39 bits. Similar to the inputs for the physical view, the inputs to the macro 160 include at least a data input Data In (e.g., to the ECC encoder 161), an address input Address to the memories 150, and a control input Ctrl to the memories 150. The outputs from the macro 160 include at least a data output Out from the ECC checker 162, error indicator Uncorrectable Error from the ECC checker 162, and error indicator Correctable Error from the ECC checker 162. In an embodiment, the SIU 130 selects one of the physical or logical (i.e., the macro 160) views of the memories 150 to test via a selection signal MBIST Select. For example, the physical view of the memories 150 is tested if the MBIST Select signal is "0" and the macro 160 is tested if the MBIST Select signal is "1." In an another embodiment, the physical view of the memories 150 is tested if the MBIST Select signal is "1" and the macro 160 is tested if the MBIST Select signal is "0."

In an embodiment, if the physical view of the memories 150 is selected, the SIU 130 generates command and address sequence of the data that gets presented to the memories 150 (e.g., via data input Data in, address input Addr, and control input Ctrl) when (i) data is being written onto the memories 150, (ii) data is being presented for comparison, and (iii) the memories 150 are being read. In an embodiment, the address data received at Addr refers to the location in the memories 150 at which the next word, or string of data bits, received at the Data In is to be accessed for one of storage or retrieval. Further, the control data received at Ctrl could provide a variety of different information. In some embodiments, the control data enables the memories 150 for data storage. In some embodiments, the control data is a clock signal, which provides the memories 150 with the ability to synchronize data storage on a virtual memory stack. In some embodiments, the control data indicates whether the memories 150 are receiving data upon a latch according to a write operation. In some embodiments, the control data indicates whether the memories 150 are transmitting data upon a latching according to a read operation. In some embodiments, several different types of control data are provided on a plurality of control inputs available on the memories 150.

In an embodiment, each SIU 130 feeds both (i) the command and address sequence into the memories 150 and (ii) expected data into a first input of the DCU 140. Then, based on the command and address sequence fed into the memories 150, the memories 150 generate outputs, which are received by another input of the corresponding DCUs 140. In an embodiment, the DCU 140 compares the expected data from the SIU 130 with the output from the memories 150. In an embodiment, the expected data from the SIU 130 is received by the DCU 140 at the same time as the output from the memories 150. In an embodiment, based on the comparison, the DCU 140 is then able to determine if the memories 150 include any failing data bits. For example, if the DCU 140 determines that the expected values are equivalent to the output from the memories 150, then it is likely that the associated data bits are functioning properly. However, if the DCU 140 detects any mis-compares, then it is likely that the associated data bits are not functioning properly, i.e., failing. After the comparison, the DCU 140 transmits the result of the comparison, i.e., working or failing, to the SIU 130 for further processing. In an embodiment, a working bit may be associated with a logical value of "0," while a failing bit may be associated with a logical value of "1."

On the other hand, if the logical view of the memories 150 is selected for testing, the SIU 130 provides the command and address sequence of the data to the macro 160. In an embodiment, the ECC encoder 161 manipulates the data provided by the Data In. The data manipulation performed by the ECC encoder 161 can in some embodiments involve concatenating at least one additional bit to the originally provided bit string. The at least one additional bit string is generated and attached to the original bit string by the ECC encoder 161 in order to provide a check-bit. A check-bit may alternatively be referred to, in some embodiments, as a parity bit. The addition of this information enables the ECC logic to, at a later point in time, determine whether the code includes errors. Generally, the check bit is added to the end (e.g., after the last bit in the transmission line) of the original bit string. In some embodiments, the check bit is provided at the first end of the original bit string, and in some embodiments, the check bit is inserted between bits in the original bit string. Further, similar to the physical view of the memories, (i) the address data received at Address refers to the location in the memories 150 at which the next word, or string of data bits, received at the Data In is to be accessed for one of storage or retrieval and (ii) the control data received at Ctrl could provide a variety of different information. Further, in an embodiment, data provided from the memories 150 are received by the ECC checker 162. The ECC checker 162 analyzes the output from the physical memory (i.e., memories 150), including the concatenated bits. In an embodiment, the ECC checker 162 removes the concatenated bits. Then, the ECC checker 162 includes logic that modifies the string of bits, as necessary, based on any errors that were reported from the data included in the check-bits to correct any faults. The corrected data is provided at the data output Data Out of the ECC checker 162.

Further, depending on the type of error, single-bit or multi-bit, the ECC checker 162 can also output an error indication. In an embodiment, the ECC checker 162 may be a single-bit correct, multi-bit detect. In other words, the ECC checker 162 may detect and correct single-bit failures but is only able to detect multi-bit failures. For example, if there was a single bit of error that was then corrected by the ECC checker 162, the Correctable Error indicator will be activated, e.g., output a value of "1." However, if multiple bits are corrupted and the ECC checker 162 can't correct the errors, the Uncorrectable Error indicator will be activated, e.g., output a value of "1." In another embodiment, the ECC checker may be an N-bit correct, M-bit detect, where M is an integer greater than N. On the other hand, if there were no errors in the data string according to the check bit data, then the bit string minus the concatenated bits is provided at the output of the ECC checker 162. In this case, both of the Correctable Error indicator and the Uncorrectable Error indicator will output a value of "0." Further, as depicted in the figure, the outputs from the macro 160, i.e., Data Out, Correctable Error, and Uncorrectable Error, are provided to the DCU 140 to be compared with expected values of the Data Out, Correctable Error, and Uncorrectable Error. As such, based on the comparison, it can be determined if the logical memory includes any failures.

Further, in an embodiment, the system 100 also includes functional logic 105 and 106, physical module multiplexers 50a to 50c, and logical module multiplexers 60a to 60c. In an embodiment, the physical module multiplexers 50a to 50c are used to control the flow of data (e.g., Data In, Addr, Ctrl) into the memories 150 and the logical module multiplexers 60a to 60c are used to control the flow of data (e.g., Data In, Address, Ctrl) into the macro 160. As such, if the physical view of the memories 150 is selected for testing, the physical module multiplexers 50a to 50c will be activated (e.g., via the MBIST Select signal) to receive data from the SIU 130 while the logical module multiplexers 60a to 60c will remain deactivated and, therefore, will not receive data from the SIU 130. On the other hand, if the logical view of the memories 150 is selected for testing, the logical module multiplexers 60a to 60c will be activated (e.g., via the MBIST Select signal) to receive data from the SIU 130 while the physical module multiplexers 50a to 50c will remain deactivated and, therefore, will not receive data from the SIU 130. However, as depicted in the figure, during the test of the logical view of the memories 150, the physical module multiplexers 50a to 50c are able to receive data output from the ECC encoder 161 and the logical module multiplexers 60b and 60c, respectively.

In an embodiment, the physical module multiplexers 50a to 50c and the logical module multiplexers 60a to 60c allow data to be fed into the memories 150 from either the SIU 130 or via the regular functional (i.e., non-test mode) path, e.g., the functional logic 105. Similarly, on the output side of the memory, the output (e.g., Data Out, Correctable Error, and Uncorrectable Error) may be provided to the DCU 140 for comparison purposes or through the regular functional path e.g., functional logic 106.

Figure 2A:
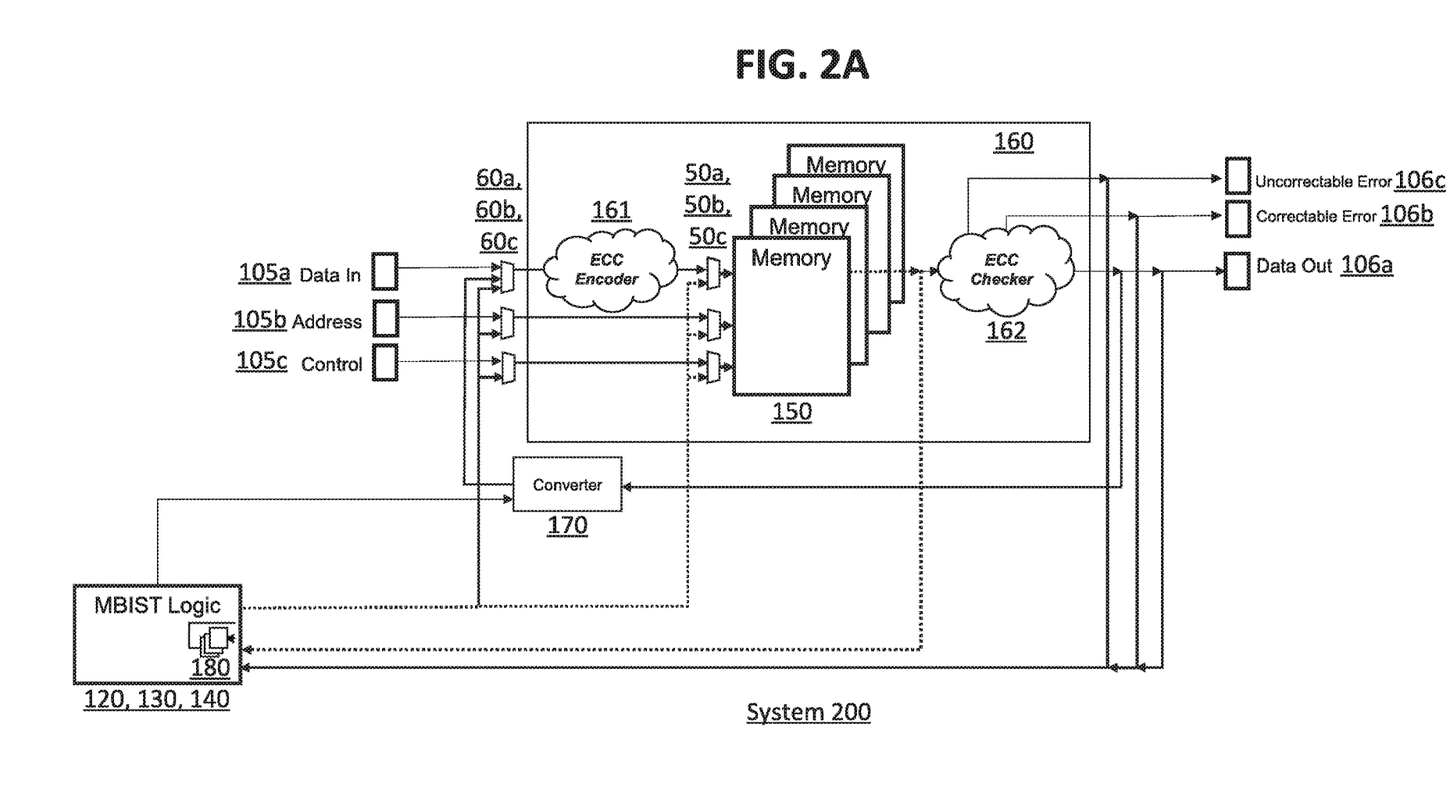
FIG. 2A illustrates an MBIST diagnostics system in accordance with an example embodiment of the present invention.

FIG. 2A illustrates an MBIST diagnostics system in accordance with an example embodiment of the present invention. In particular, the figure depicts an MBIST diagnostics system 200 during a physical memory test. In an embodiment, the system 200 includes all of the same components as the system 100 and also includes inputs 105a, 105b, and 105c and outputs 106a, 106b, and 106c. In an embodiment, the system 200 also includes a converter 170 and an accumulator 180, which are utilized during a functional operation test, e.g., FIG. 2C, and, as such, will be discussed in greater detail below. In an embodiment, the inputs 105a, 105b, and 105c and the outputs 106a, 106b, and 106c are associated with the functional logic 105 and 106, respectively, in FIG. 1. For example, input 105a corresponds to the Data In, input 105b corresponds to the Address, and input 105c corresponds to the Control. Further, output 106a corresponds the Data Out, output 106b corresponds to the Correctable Error, and output 106c corresponds to the Uncorrectable Error. In an embodiment, the inputs 105a to 105c and the outputs 106a to 106c are utilized during the functional (i.e., non-test) mode of the memory 150. Further, the figure also depicts, via dotted lines, the interaction between the elements of the system 200 during a test of the physical memories 150. For example, as indicated by the dotted lines, the MBIST logic (i.e., AMU 120, SIU 130, and DCU 140) interacts with the physical module multiplexers 50a to 50c and the memories 150 during the test of the physical memories 150. Specifically, the physical module multiplexers 50a to 50c provide, as inputs, data from the MBIST logic (i.e., the SIU 130) to the memories 150. In addition, the MBIST logic (i.e., the DCU 140) receives the corresponding outputs from the memories 150 for further processing. In an embodiment, during the physical memory test, the MBIST logic interfaces directly with the physical memories, fully testing the memory cell array and peripheral logic (e.g., address decoders, sense amps, etc.) through knowledge of the physical layout of the memory cells. This allows for the testing of the memory to stress every desired type of fault in MFGT and POST, with POST typically using a reduced set of tests for the reasons mentioned above.

Figure 2B:
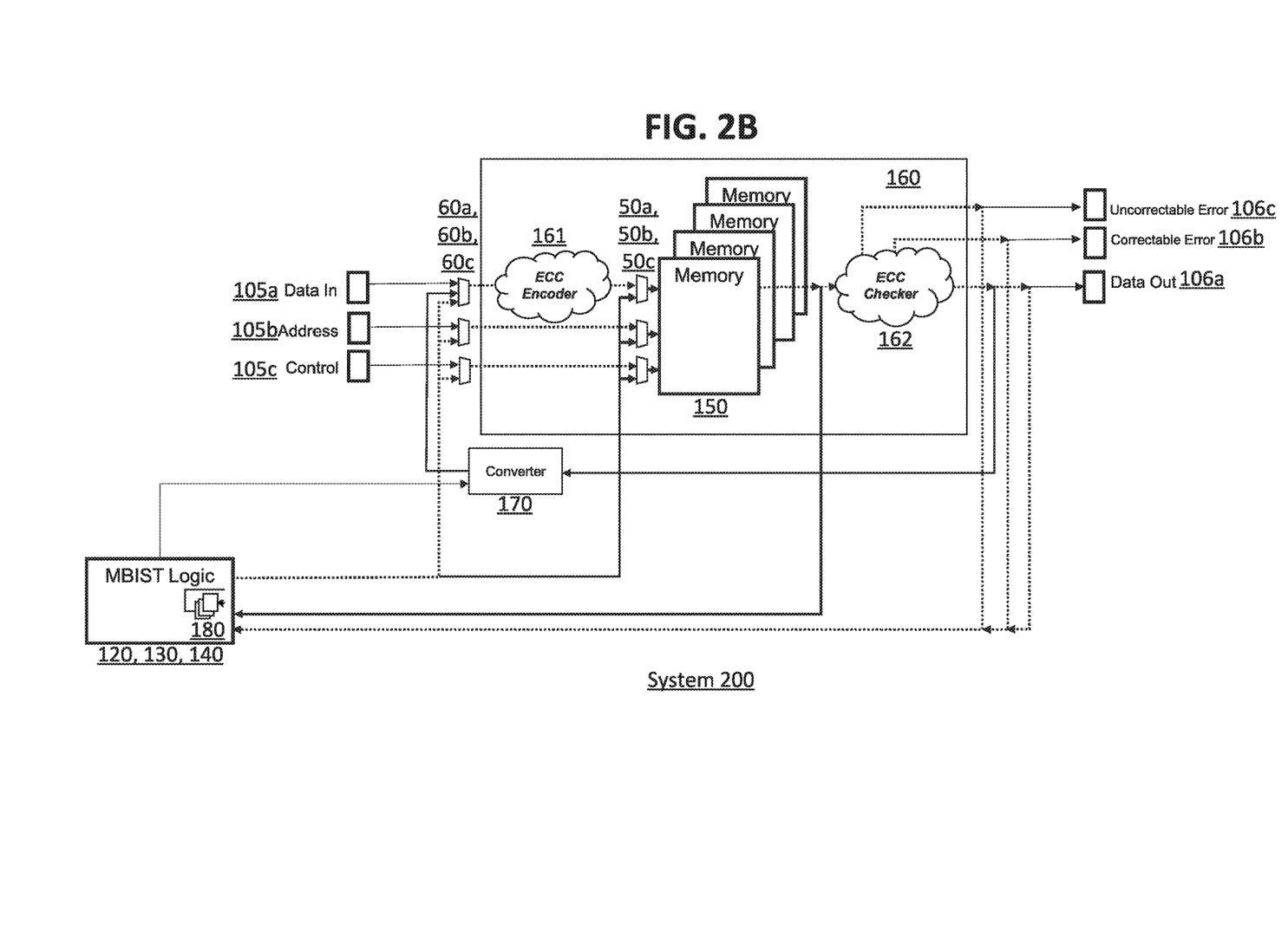
FIG. 2B illustrates another embodiment of the MBIST diagnostics system depicted in FIG. 2A.

FIG. 2B illustrates another embodiment of the MBIST diagnostics system depicted in FIG. 2A. In particular, the figure depicts the system 200 during a logical memory test. In an embodiment, as indicated by the dotted lines, the MBIST logic (i.e., AMU 120, SIU 130, and DCU 140) interacts with the logical module multiplexers 60a to 60c, the ECC encoder 161, the physical module multiplexers 50a to 50c, the memories 150, and the ECC checker 162 during the test of the macro 160. Specifically, the logical module multiplexers 60a to 60c provide, as inputs, data from the MBIST logic (i.e., the SIU 130) to the macro 160. As depicted in the figure, the logical module multiplexer 60a provides the input from the MBIST logic to the ECC encoder 161. The ECC encoder 161 then provides the ECC-encoded input data to the physical module multiplexer 50a, which then provides the ECC-encoded input data to the memories 150. Further, the logical module multiplexer 60b and 60c provide inputs from the MBIST logic (e.g., Address and Control data) to the physical module multiplexers 50b and 50c, respectively, which then provide the input data to the memories 150. In addition, the ECC checker 162(i) receives the corresponding outputs from the memories 150 and (ii) outputs, in response, error indicators Correctable Error and Uncorrectable Error and Data Out, which are all then received by MBIST logic (i.e., the DCU 140) for further processing. As such, in an embodiment, the MBIST logic can connect as a secondary target to the same memories (i.e., the memories 150) through the ECC logic. This supports nearly full memory cell array and peripheral logic testing, but also includes testing the ECC logic functionality. With this, the MBIST logic can sample additional functional signals such as Correctable Error and Uncorrectable Error to determine the effectiveness of the ECC logic as well as the number of memory word failures. Further, similar to the physical memory test described in relation to FIG. 2A, the logical memory test can be utilized in both MFGT and POST.

Figure 2C:
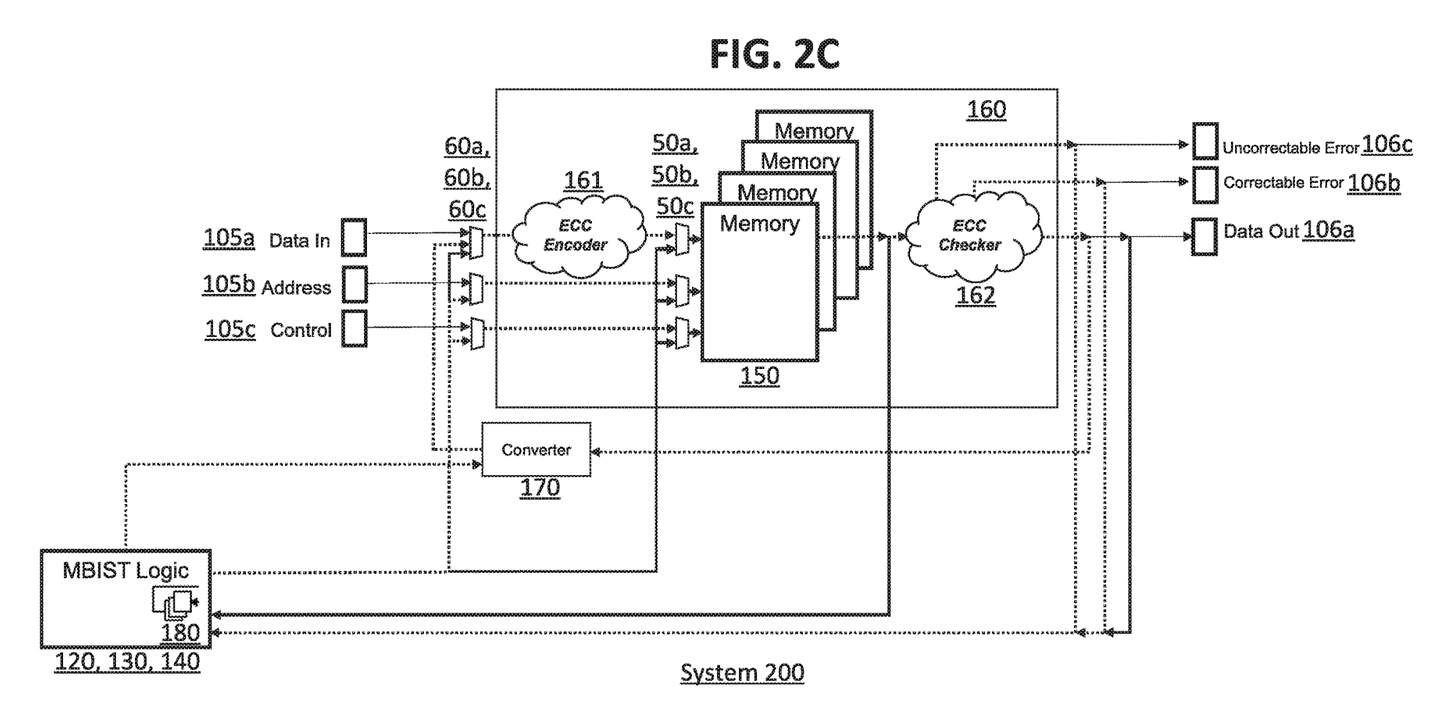
FIG. 2C illustrates another embodiment of the MBIST diagnostics system depicted in FIG. 2A.

FIG. 2C illustrates another embodiment of the MBIST diagnostics system depicted in FIG. 2A. In particular, the figure depicts the system 200 during a functional operation test, e.g., MMST. In an embodiment, unlike the physical and logical memory tests discussed above, during the functional operation test, the system 200 also utilizes the converter 170 and the accumulator 180. In an embodiment, the converter 170 receives (i.e., reads) functional data from the memories 150 and manipulates said functional data to achieve as many different data patterns in the memories 150 as possible. For example, after converting the functional data, the converter 170 feeds the converted functional data to logical module multiplexer 60a, which then provides the converted functional data to the ECC encoder 161. The ECC encoder 161 then provides the ECC-encoded data to the physical module multiplexer 60a, which then writes the ECC-encoded data to the memories 150. Further, the logical module multiplexer 60b and 60c provide inputs from the MBIST logic (e.g., Address and Control data) to the physical module multiplexers 50b and 50c, respectively, which then provide the input data to the memories 150. In addition, the ECC checker 162(i) receives the corresponding outputs from the memories 150 and (ii) outputs, in response, error indicators Correctable Error and Uncorrectable Error, which are then received by MBIST logic for further processing. In an embodiment, the MBIST logic (i.e., the SIU 130) may include the accumulator 180 to count the occurrences of the Correctable Error and Uncorrectable Error indications. In an embodiment, the SIU 130 may also compare the indication count in the accumulator 180 to a safety threshold. As such, if it's determined by the SIU 130 that the indication count exceeds the safety threshold, an interrupt can be raised, e.g., during the next POST. In particular, the interrupt can be raised at the end of the current test interval as the block comes back online to the RTOS. In an embodiment, the safety threshold can be established by monitoring how many error indications (i.e., Correctable Error and Uncorrectable Error) correspond to an actual operational failure. In another embodiment, the MBIST logic can monitor the error indication signals during test cycles to determine the safety threshold, at which time the RTOS can report potential problems to the user.

In an embodiment, the functional data may be converted and applied to the memories 150 for a number of passes until the original functional data is written back into the memories 150. In an embodiment, the functional data is converted and applied to the memories 150 an address space at a time. For example, assuming the memories 150 include N word addresses, during a first pass, the converter 170 would read and convert the word at address 0 and then write the converted word back into address 0. The converter 170 would continue this process for N word addresses, i.e., until the converter 170 writes a converted word back into address N−1. In another embodiment, instead of the full address space, the converter 170 can continue the process for only a subset of the word addresses in the memories 150. Further, in an embodiment, after every read during the first pass, the ECC checker 162 may also indicate to the accumulator 180 if the corresponding word address included any correctable or uncorrectable errors (e.g., via the Correctable Error and Uncorrectable Error indications). In an embodiment, because each of the addresses include a respective converted word after the first pass, the converter 170 needs to perform at least a second pass of the memories 150 in order to write the original functional data back into the memories. Specifically, by converting a previously converted word, i.e., de-converting, the converter 170 is able to write the original functional data back into the respective word address. For example, during the at least second pass, the converter 170 would read and convert the previously converted word at each address and then write the original functional data back into the respective address. Further, similar to the first pass, any correctable or uncorrectable errors may be provided to the accumulator 180 by the ECC checker 162 after a respective read. As such, after the first and at least second passes, the memories 150 can be tested with a variety of test patterns without destroying the original functional data. Further, based on the first and second passes, it can be determined, via the accumulator 180, if the memories 150 included too many errors and, therefore, if they require repair or replacement. Accordingly, with the present invention, the MBIST logic may utilize the ECC logic to "scrub" soft (e.g., intermittent) errors due to cosmic radiation and embedded radioactive device impurities, leaving corrected data in the memory locations, and reducing the likelihood of encountering uncorrectable errors which indicate lost data.

In an embodiment, the converter 170 may be an inverter. For example, the converter 170 would invert a "0" into a "1" and a "1" into a "0." Further, the test algorithm for the first and the at least second passes may read as follows: read data, write inverted data, read inverted data, write original functional data. In another embodiment, the converter may perform an end-to-end flip operation. For example, the converter 170 would flip the bits in the most significant bit positions of a data word to the least significant bit positions. In an embodiment, the test algorithm for the first and second passes of such a conversion may read as follows: read data, write flipped data, read flipped data, write original functional data. In an embodiment, the converter 170 may be a combination of the inverter and the end-to-end flip operation. As such, in order for the original functional data to be returned to the memories 150, more than two passes (i.e., of reading and writing) of the test algorithm might be required.

In an embodiment, the test algorithms may be provided in a test plan used to test the memories 150. In an embodiment, the test plan includes a set of one or more algorithms as well as a set of test conditions associated with the algorithms. In an embodiment, the algorithms can either be hardwired-in or programmed. In an embodiment, hardwired algorithms are compiled in the MBIST hardware and, therefore, are embedded in the hardware itself. Accordingly, once they're built, they cannot be changed. Further, although programmed algorithms are not compiled in MBIST hardware, they do require additional logic or JTAG controls. Further, the programmable algorithms are programmable (e.g., modifiable) based on the limits defined by either software or a user, e.g., a chip designer. In an embodiment, the test conditions may include the address order (e.g., fast column, fast row, or fast diagonal), the address update (e.g., linear or complement), the data background, and the sequence iterator.

Further, in an embodiment, the test algorithms may be administered and controlled by the MBIST logic (i.e., the AMU 120 and the SIU 130). For example, the SIU 130 indicates to the converter 170 when to read and convert a particular word. In addition, via the Address and Control data provided to the logical module multiplexers 60b and 60c, the SIU 130 also determines which address space portion is being utilized as well as the controls (e.g., write) associated with that address space portion. In other words, the Address and Control data allow the test algorithms to cycle through each of the address space portions.

Accordingly, by utilizing the converter 170 and the accumulator 180 during MMST, the system 200 can efficiently test the memories 150 without destroying the original functional data.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of Embodiments, with each claim standing on its own as a separate embodiment of the invention.

Moreover, it will be apparent to those skilled in the art from consideration of the specification and practice of the present disclosure that various modifications and variations can be made to the disclosed systems without departing from the scope of the disclosure, as claimed. Thus, it is intended that the specification and examples be considered as exemplary only, with a true scope of the present disclosure being indicated by the following claims and their equivalents.

The invention claimed is:

1. A memory built-in self-test (MBIST) diagnostics system comprising:
    at least one physical memory;
    MBIST logic comprising:
        an algorithm memory unit (AMU) configured to store at least one memory test program;
        at least one sequence iterator unit (SIU) configured to receive the at least one memory test program from the AMU one line at a time, to generate a command and address sequence based on the received line of the at least one memory test program, to generate an MBIST select signal, and to transmit expected data;
        at least one data compare unit (DCU) configured to receive the expected data from the at least one SIU, to compare the expected data with read data, to generate at least one result signal based on the comparison, and to transmit the at least one result signal at least to the at least one SIU; and
        an accumulator configured to accumulate an error count based on the result signal;
    a converter configured to perform a reversible transformation on at least one data word;
    three physical module multiplexers, including a data-in physical module multiplexer, an address physical module multiplexer, and a control physical module multiplexer, each physical module multiplexer configured to receive the MBIST select signal as a multiplexer selection signal to select between different data inputs of each physical module multiplexer;
    error correction code (ECC) encoder circuitry coupled to a write input of the at least one physical memory via the data-in physical module multiplexer;
    ECC checker circuitry coupled to a read output of the at least one physical memory, the at least one physical memory, ECC encoder, and ECC checker forming a logical memory; and
    at least three logical module multiplexers, including at least a data-in logical module multiplexer, an address logical module multiplexer, and a control logical module multiplexer, the data-in logical module multiplexer configured to selectively pass to the ECC encoder circuitry a data-in signal from one of functional logic, the MBIST logic, or the converter, the address and control logical module multiplexers configured to selectively pass to the address and control physical module multiplexers address and control signals, respectively, from one of the functional logic or the MBIST logic, each logical module multiplexer configured to receive the MBIST select signal as a multiplexer selection signal to select between different data inputs of each logical module multiplexer,
    the converter having a control input coupled to the MBIST logic, a data input coupled to a data-out output of the logical memory, and a data output coupled to a data input of the data-in logical module multiplexer,
    the MBIST logic having data-in, address, and control outputs coupled to the physical module multiplexers and the logical module multiplexers, and
    the MBIST select signal configuring the MBIST diagnostics system between one of a test of the at least one physical memory, a test of the logical memory, a functional operation test, or a non-test mode.

2. The system of claim 1, wherein the converter is configured to perform a bit inversion, an end-to-end flip operation, or both as the reversible transformation.

3. The system of claim 1, wherein the converter is configured to perform either an end-to-end flip operation or an end-to-end flip operation in combination with a bit inversion as the reversible transformation.

4. The system of claim 1, wherein based on the MBIST select signal configuring the MBIST diagnostics system to perform the test of the at least one physical memory,
    the data-in physical module multiplexer is configured to pass data from the MBIST logic to the at least one physical memory, bypassing the ECC encoder circuitry,
    the address physical module multiplexer is configured to pass an address signal from the MBIST logic to the at least one physical memory,
    the control physical module multiplexer is configured to pass a memory control signal from the MBIST logic to the at least one physical memory, and
    the MBIST logic is configured to receive data from the at least one physical memory, bypassing the ECC checker circuitry.

5. The system of claim 1, wherein based on the MBIST select signal configuring the MBIST diagnostics system to perform the test of the logical memory,
    the data-in logical module multiplexer is configured to pass data from the MBIST logic to the ECC encoder circuitry,
    the address logical module multiplexer is configured to pass an address from the MBIST logic to the address physical module multiplexer,
    the control logical module multiplexer is configured to pass a memory control signal from the MBIST logic to the control physical module multiplexer,
    the data-in physical module multiplexer is configured to pass data from the ECC encoder circuitry to the at least one physical memory,
    the address physical module multiplexer is configured to pass the address from the address logical module multiplexer to the at least one physical memory,
    the control physical module multiplexer is configured to pass the memory control signal from the control logical module multiplexer to the at least one physical memory, and the MBIST logic is configured to receive data from the ECC checker circuitry, rather than directly from the at least one physical memory.

6. The system of claim 1, wherein based on the MBIST select signal configuring the MBIST diagnostics system to perform the functional operation test, the data-in logical module multiplexer is configured to pass data from the converter to the ECC encoder circuitry, the address logical module multiplexer is configured to pass an address from the MBIST logic to the address physical module multiplexer, the control logical module multiplexer is configured to pass a memory control signal from the MBIST logic to the control physical module multiplexer, the data-in physical module multiplexer is configured to pass data from the ECC encoder circuitry to the at least one physical memory, the address physical module multiplexer is configured to pass the address from the address logical module multiplexer to the at least one physical memory, the control physical module multiplexer is configured to pass the memory control signal from the control logical module multiplexer to the at least one physical memory, and the MBIST logic and the converter are both configured to receive data from the ECC checker circuitry, rather than directly from the at least one physical memory.

7. The system of claim 1, wherein based on the MBIST select signal configuring the MBIST diagnostics system in the non-test mode, the data-in logical module multiplexer is configured to pass data from the functional logic to the ECC encoder circuitry, the address logical module multiplexer is configured to pass an address from the functional logic to the address physical module multiplexer, the control logical module multiplexer is configured to pass a memory control signal from the functional logic to the control physical module multiplexer, the data-in physical module multiplexer is configured to pass data from the ECC encoder circuitry to the at least one physical memory, the address physical module multiplexer is configured to pass the address from the address logical module multiplexer to the at least one physical memory, and the control physical module multiplexer is configured to pass the memory control signal from the control logical module multiplexer to the at least one physical memory.

8. The system of claim 1, wherein, the system is configured to raise an interrupt upon determining that the error count exceeds a threshold.

9. The system of claim 1, wherein the functional operation test is a mission mode self-test (MMST) capable of testing memory without destroying any functional data within the tested memory.

10. The system of claim 1, further comprising a test access method (TAM) unit having an output coupled to an input of the AMU, the TAM unit implementing one of a Joint Test Action Group (JTAG) or a Direct Access interface.

11. The system of claim 1, wherein the logical memory is configured to provide each of a correctable error signal and an uncorrectable error signal to the MBIST logic in either of the test of the logical memory or the functional operation test.

12. The system of claim 1, wherein the test of the physical memory and the test of the logical memory are configured as manufacturing tests (MFGTs) or power-on-self-tests (POSTS).

13. A diagnostics method for a memory built-in self-test (MBIST), the method comprising:

selecting, based on an MBIST select signal, one from among of a group comprising (i) a test of at least one physical memory, (ii) a test of a logical memory comprising the at least one physical memory and error correction code (ECC) encoder circuitry and ECC checker circuitry, (iii) a functional operation test, or (iv) a non-test mode;

based on the selection of the test of the at least one physical memory, configuring physical module multiplexers to pass write data and address and control signals to the at least one physical memory from MBIST logic, and configuring the MBIST logic to receive read data from the at least one physical memory, bypassing the ECC encoder and checker circuitry;

based on the selection of the test of the logical memory, configuring logical module multiplexers to pass write data from the MBIST logic to the ECC encoder circuitry and to pass address and control signals from the MBIST logic to respective ones of the physical module multiplexers, and configuring the MBIST logic to receive read data from the logical memory;

based on the selection of the functional operation test, configuring the logical module multiplexers to pass write data from a converter, configured to perform reversible data transformations, to the ECC encoder circuitry and to pass address and control signals from the MBIST logic to respective ones of the physical module multiplexers, and configuring the MBIST logic and the converter to receive read data from the logical memory; and based on the selection of the non-test mode, configuring the logical module multiplexers to pass write data from functional logic to the ECC encoder circuitry and to pass address and control signals from the functional logic to respective ones of the physical module multiplexers, and configuring the functional logic to receive read data from the logical memory.

14. The method of claim 13, wherein the MBIST logic comprises:

an algorithm memory unit (AMU) configured to store at least one memory test program;

at least one sequence iterator unit (SIU) configured to receive the at least one memory test program from the AMU one line at a time, to generate a command and address sequence based on the received line of the at least one memory test program, to generate the MBIST select signal, and to transmit expected data;

at least one data compare unit (DCU) configured to receive the expected data from the at least one SIU, to compare the expected data with read data, to generate at least one result signal based on the comparison, and to transmit the at least one result signal at least to the at least one SIU; and an accumulator configured to accumulate an error count based on the result signal.

15. The method of claim 14 further comprising raising an interrupt based on the error count exceeding a threshold.

16. The method of claim 13, wherein the converter performs a bit inversion, an end-to-end flip operation, or both as the reversible transformation.

17. The method of claim 13, wherein the converter performs either an end-to-end flip operation or an end-to-end flip operation in combination with a bit inversion as the reversible transformation.

18. The method of claim 13, wherein the functional operation test is a mission mode self-test (MMST) capable of testing memory without destroying any functional data within the tested memory.

19. The method of claim 13, further comprising providing each of a correctable error signal and an uncorrectable error signal to the MBIST logic in either of the test of the logical memory or the functional operation test.

20. The method of claim 13, wherein each of the test of the physical memory and the test of the logical memory are conducted during a manufacturing test (MFGT) or a power-on-self-test (POST).

* * * * *